(12) United States Patent
Hung et al.

(10) Patent No.: US 9,847,398 B1
(45) Date of Patent: Dec. 19, 2017

(54) SEMICONDUCTOR DEVICE WITH GATE STRUCTURE HAVING DIELECTRIC LAYER ON ONE SIDE AND CONTACT PLUG ON THE OTHER SIDE

(71) Applicant: UNITED MICROELECTRONICS CORP., Hsin-Chu (TW)

(72) Inventors: Yu-Hsiang Hung, Tainan (TW); Chih-Kai Hsu, Tainan (TW); Ssu-I Fu, Kaohsiung (TW); Wei-Chi Cheng, Kaohsiung (TW); Jyh-Shyang Jenq, Pingtung County (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 15/208,616

(22) Filed: Jul. 13, 2016

(51) Int. Cl.
*H01L 29/423* (2006.01)
*H01L 23/528* (2006.01)
*H01L 21/768* (2006.01)
*H01L 29/66* (2006.01)

(52) U.S. Cl.
CPC .. *H01L 29/42364* (2013.01); *H01L 21/76832* (2013.01); *H01L 21/76897* (2013.01); *H01L 23/5283* (2013.01); *H01L 29/66545* (2013.01)

(58) Field of Classification Search
CPC .......... H01L 29/42364; H01L 23/5283; H01L 23/66545
See application file for complete search history.

(56) References Cited

U.S. PATENT DOCUMENTS

| | | | | |
|---|---|---|---|---|
| 8,895,396 | B1* | 11/2014 | Fu | H01L 21/82341 438/197 |
| 9,379,119 | B1* | 6/2016 | Huang | H01L 27/1104 |
| 2011/0095379 | A1* | 4/2011 | Wong | H01L 21/28079 257/402 |
| 2011/0108930 | A1* | 5/2011 | Cheng | H01L 21/76831 257/412 |
| 2011/0156107 | A1* | 6/2011 | Bohr | H01L 21/76831 257/288 |
| 2012/0056245 | A1* | 3/2012 | Kang | H01L 21/0245 257/192 |
| 2012/0135577 | A1* | 5/2012 | Lee | H01L 21/76895 438/299 |
| 2012/0248511 | A1* | 10/2012 | Guo | H01L 29/6653 257/288 |
| 2013/0020658 | A1* | 1/2013 | Guo | H01L 29/4958 257/412 |
| 2014/0017863 | A1* | 1/2014 | Lee | H01L 29/66477 438/238 |

(Continued)

OTHER PUBLICATIONS

Yu-Hsiang Hung, Title of Invention: Semiconductor Device and Method of Forming the Same, U.S. Appl. No. 15/014,034, filed Feb. 3, 2016.

(Continued)

*Primary Examiner* — Nathan W Ha
(74) *Attorney, Agent, or Firm* — Winston Hsu

(57) ABSTRACT

A semiconductor device is disclosed. The semiconductor device includes: a substrate; a gate structure on the substrate; a spacer around the gate structure; a contact etch stop layer (CESL) on the spacer; an interlayer dielectric (ILD) layer adjacent to one side of the gate structure and contacting the CESL; and a contact plug adjacent to another side of the gate structure and contacting the CESL.

9 Claims, 7 Drawing Sheets

(56) References Cited

U.S. PATENT DOCUMENTS

| | | | | |
|---|---|---|---|---|
| 2014/0099784 A1* | 4/2014 | Kim | H01L 29/511 | 438/589 |
| 2014/0151817 A1* | 6/2014 | Bohr | H01L 21/76831 | 257/410 |
| 2014/0183652 A1* | 7/2014 | Chern | H01L 27/0207 | 257/369 |
| 2015/0021683 A1* | 1/2015 | Xie | H01L 29/6653 | 257/330 |
| 2015/0061042 A1* | 3/2015 | Cheng | H01L 29/4966 | 257/412 |
| 2015/0145023 A1* | 5/2015 | Arigane | H01L 27/11568 | 257/326 |
| 2015/0187905 A1* | 7/2015 | Cai | H01L 29/6681 | 257/288 |
| 2015/0235897 A1* | 8/2015 | Fu | H01L 21/76879 | 438/299 |
| 2015/0236019 A1* | 8/2015 | Basker | H01L 27/0924 | 257/401 |
| 2015/0262822 A1* | 9/2015 | Hung | H01L 21/28088 | 257/412 |
| 2015/0270216 A1* | 9/2015 | Bohr | H01L 21/76831 | 257/401 |
| 2015/0279996 A1* | 10/2015 | He | H01L 29/7851 | 257/288 |
| 2016/0049496 A1* | 2/2016 | Lu | H01L 21/82381 | 257/401 |
| 2016/0225777 A1* | 8/2016 | Cheng | H01L 27/11521 | |

OTHER PUBLICATIONS

Yu-Hsiang Hung, Title of Invention: Method for Fabricating Contacts to Non-Planar MOS Transistors in Semiconductor Device, U.S. Appl. No. 14/880,284, filed Oct. 12, 2015.

* cited by examiner

US 9,847,398 B1

SEMICONDUCTOR DEVICE WITH GATE STRUCTURE HAVING DIELECTRIC LAYER ON ONE SIDE AND CONTACT PLUG ON THE OTHER SIDE

BACKGROUND OF THE INVENTION

1. Field of the Invention

The invention relates to a semiconductor device, and more particularly to a gate structure having an interlayer dielectric (ILD) layer on one side and contact plug on the other side.

2. Description of the Prior Art

With the trend in the industry being towards scaling down the size of the metal oxide semiconductor transistors (MOS), three-dimensional or non-planar transistor technology, such as fin field effect transistor technology (FinFET) has been developed to replace planar MOS transistors. Since the three-dimensional structure of a FinFET increases the overlapping area between the gate and the fin-shaped structure of the silicon substrate, the channel region can therefore be more effectively controlled. This way, the drain-induced barrier lowering (DIBL) effect and the short channel effect are reduced. The channel region is also longer for an equivalent gate length, thus the current between the source and the drain is increased. In addition, the threshold voltage of the fin FET can be controlled by adjusting the work function of the gate.

However, the approach of using etching process to remove the hard mask from gate structure on the edge of fin-shaped structure in current FinFET process and also forming contact holes typically results in uneven openings affecting the formation of contact plugs thereafter and the performance of the device. Hence, how to improve the current process to resolve this issue has become an important task in this field.

SUMMARY OF THE INVENTION

According to a preferred embodiment of the present invention, a semiconductor device includes: a substrate; a gate structure on the substrate; a spacer around the gate structure; a contact etch stop layer (CESL) on the spacer; an interlayer dielectric (ILD) layer adjacent to one side of the gate structure and contacting the CESL; and a contact plug adjacent to another side of the gate structure and contacting the CESL.

These and other objectives of the present invention will no doubt become obvious to those of ordinary skill in the art after reading the following detailed description of the preferred embodiment that is illustrated in the various figures and drawings.

DETAILED DESCRIPTION

Referring to FIGS. 1-6, FIGS. 1-6 illustrate a method for fabricating semiconductor device according to a preferred embodiment of the present invention. It should be noted that despite this embodiment pertains to a non-planar MOS transistor, the method of the present invention could be applied to either planar or non-planar transistor devices depending on the demand of the product.

Figure 1:
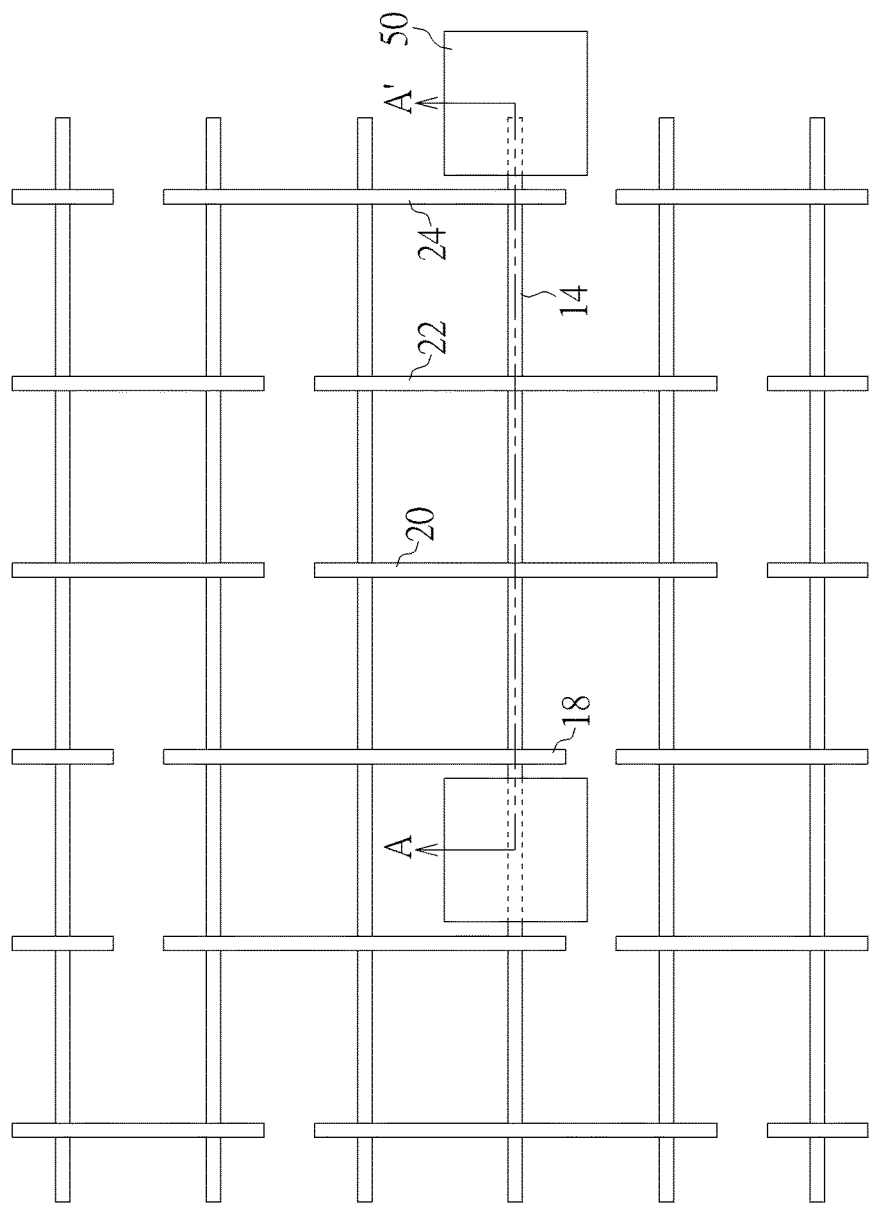
FIG. 1 illustrates a top view for fabricating a semiconductor device according to a preferred embodiment of the present invention.
Figure 2:
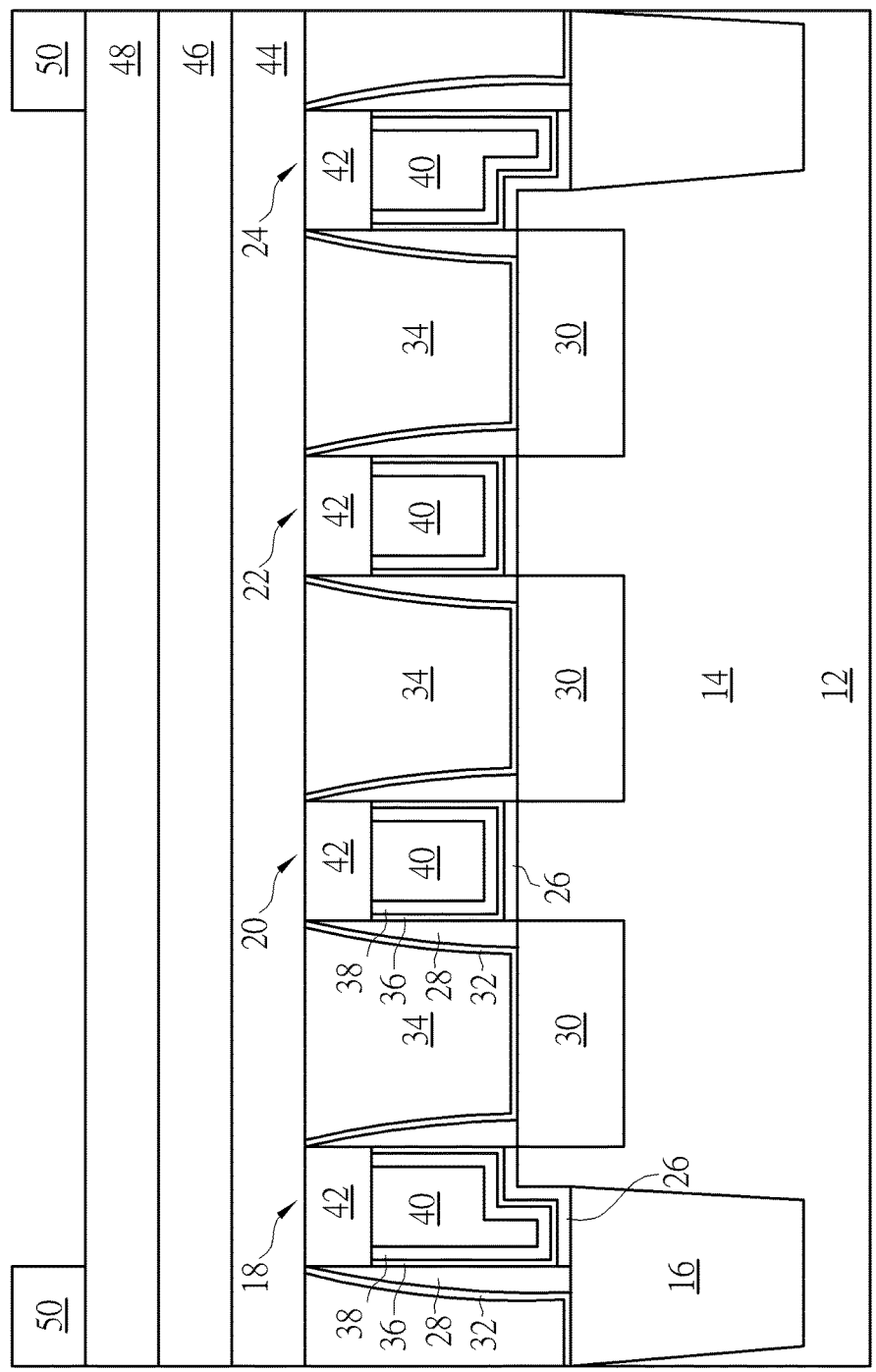
FIG. 2 illustrates a cross-sectional view of FIG. 1 along the sectional line AA'.

First, referring to FIGS. 1-2, in which FIG. 1 illustrates a top view for fabricating a semiconductor device according to a preferred embodiment of the present invention and FIG. 2 illustrates a cross-sectional view of FIG. 1 along the sectional line AA'. As shown in FIGS. 1-2, a substrate 12, such as a silicon substrate or silicon-on-insulator (SOI) substrate is provided. Fin-shaped structures 14 are then formed on the substrate 12, in which the bottom of the fin-shaped structures 14 is enclosed by a shallow trench isolation (STI) 16 preferably composed of an insulating layer such as silicon oxide. Next, a plurality of gate structures 18, 20, 22, 24 are formed on the fin-shaped structure 14, in which the gate structures 18, 24 are disposed on the edges of the fin-shaped structure 14 while sitting on the fin-shaped structure 14 and the STI 16 at the same time.

According to an embodiment of the present invention, the fin-shaped structures 14 are obtained by a sidewall image transfer (SIT) process. For instance, a layout pattern is first input into a computer system and is modified through suitable calculation. The modified layout is then defined in a mask and further transferred to a layer of sacrificial layer on a substrate through a photolithographic and an etching process. In this way, several sacrificial layers distributed with a same spacing and of a same width are formed on a substrate. Each of the sacrificial layers may be stripe-shaped. Subsequently, a deposition process and an etching process are carried out such that spacers are formed on the sidewalls of the patterned sacrificial layers. In a next step, sacrificial layers can be removed completely by performing an etching process. Through the etching process, the pattern defined by the spacers can be transferred into the substrate underneath, and through additional fin cut processes, desirable pattern structures, such as stripe patterned fin-shaped structures could be obtained.

Alternatively, the fin-shaped structures 14 could also be obtained by first forming a patterned mask (not shown) on the substrate 12, and through an etching process, the pattern of the patterned mask is transferred to the substrate 12 to form the fin-shaped structure 14. Moreover, the formation of the fin-shaped structures 14 could also be accomplished by first forming a patterned hard mask (not shown) on the substrate 12, and a semiconductor layer composed of silicon germanium is grown from the substrate 12 through exposed patterned hard mask via selective epitaxial growth process to form the corresponding fin-shaped structures 14. These approaches for forming fin-shaped structures are all within the scope of the present invention.

The fabrication of the gate structures 18, 20, 22, 24 could be accomplished by a gate first process, a high-k first approach from gate last process, or a high-k last approach from gate last process. Since this embodiment pertains to a high-k last approach, dummy gates (not shown) composed of interfacial layer 26 and polysilicon material (not shown)

could be first formed on the fin-shaped structures 14 and the STI 16, and a spacer 28 is formed on the sidewall of each dummy gate. A source/drain region 30 and epitaxial layer (not shown) are then formed in the fin-shaped structures 14 and/or substrate 12 adjacent to two sides of the spacer 28, a selective contact etch stop layer (CESL) 32 is formed on the dummy gates, and an interlayer dielectric (ILD) layer 34 composed of tetraethyl orthosilicate (TEOS) is formed on the CESL. In this embodiment, the spacer 28 could be a single spacer or a composite spacer selected from the group consisting of silicon oxide, silicon nitride, silicon oxynitride (SiON), and silicon carbon nitride (SiCN), but not limited thereto.

Next, a replacement metal gate (RMG) process could be conducted to planarize part of the ILD layer 34 and then transforming the dummy gate into metal gates 18, 20, 22, 24. The RMG process could be accomplished by first performing a selective dry etching or wet etching process, such as using etchants including ammonium hydroxide (NH$_4$OH) or tetramethylammonium hydroxide (TMAH) to remove the polysilicon material from dummy gates for forming recesses (not shown) in the ILD layer 34. Next, a U-shaped high-k dielectric layer 36 and a conductive layer including at least a U-shaped work function metal layer 38 and a low resistance metal layer 40 is formed in the recesses, and a planarizing process is conducted thereafter so that the top surfaces of the U-shaped high-k dielectric layer 36, U-shaped work function metal layer 38 and low resistance metal layer 40 are even with the surface of the ILD layer 34.

In this embodiment, the work function metal layer 38 is formed for tuning the work function of the later formed metal gates to be appropriate in an NMOS or a PMOS. For an NMOS transistor, the work function metal layer 38 having a work function ranging between 3.9 eV and 4.3 eV may include titanium aluminide (TiAl), zirconium aluminide (ZrAl), tungsten aluminide (WAl), tantalum aluminide (TaAl), hafnium aluminide (HfAl), or titanium aluminum carbide (TiAlC), but it is not limited thereto. For a PMOS transistor, the work function metal layer 38 having a work function ranging between 4.8 eV and 5.2 eV may include titanium nitride (TiN), tantalum nitride (TaN), tantalum carbide (TaC), but it is not limited thereto. An optional barrier layer (not shown) could be formed between the work function metal layer 38 and the low resistance metal layer 40, in which the material of the barrier layer may include titanium (Ti), titanium nitride (TiN), tantalum (Ta) or tantalum nitride (TaN). Furthermore, the material of the low-resistance metal layer 40 may include copper (Cu), aluminum (Al), titanium aluminum (TiAl), cobalt tungsten phosphide (CoWP) or any combination thereof. Since the process of using RMG process to transform dummy gate into metal gate is well known to those skilled in the art, the details of which are not explained herein for the sake of brevity.

Next, part of the high-k dielectric layer 36, part of the work function metal layer 38, and part of the low resistance metal layer 40 could be removed, and a hard mask 42 is formed on the high-k dielectric layer 36, work function metal layer 38 and the low resistance metal layer 40 to form the gate structure 18, 20, 22, 24. The hard mask 42 could be a single material layer or composite material layer, in which the hard mask 42 could be selected from the group consisting of silicon oxide and silicon nitride.

Next, a cap layer 44 and mask layers 46, 48 are sequentially formed on the ILD layer 34 and a patterned mask 50 is formed on the mask layer 48. In this embodiment, the cap layer 44 and mask layers 46, 48 are preferably made of different material. For instance, the cap layer 44 is composed of silicon oxide, the mask layer 46 is composed of TiN, the mask layer 48 is composed of silicon nitride, and the patterned mask 50 is composed of SiOCN, but not limited thereto.

Figure 3:
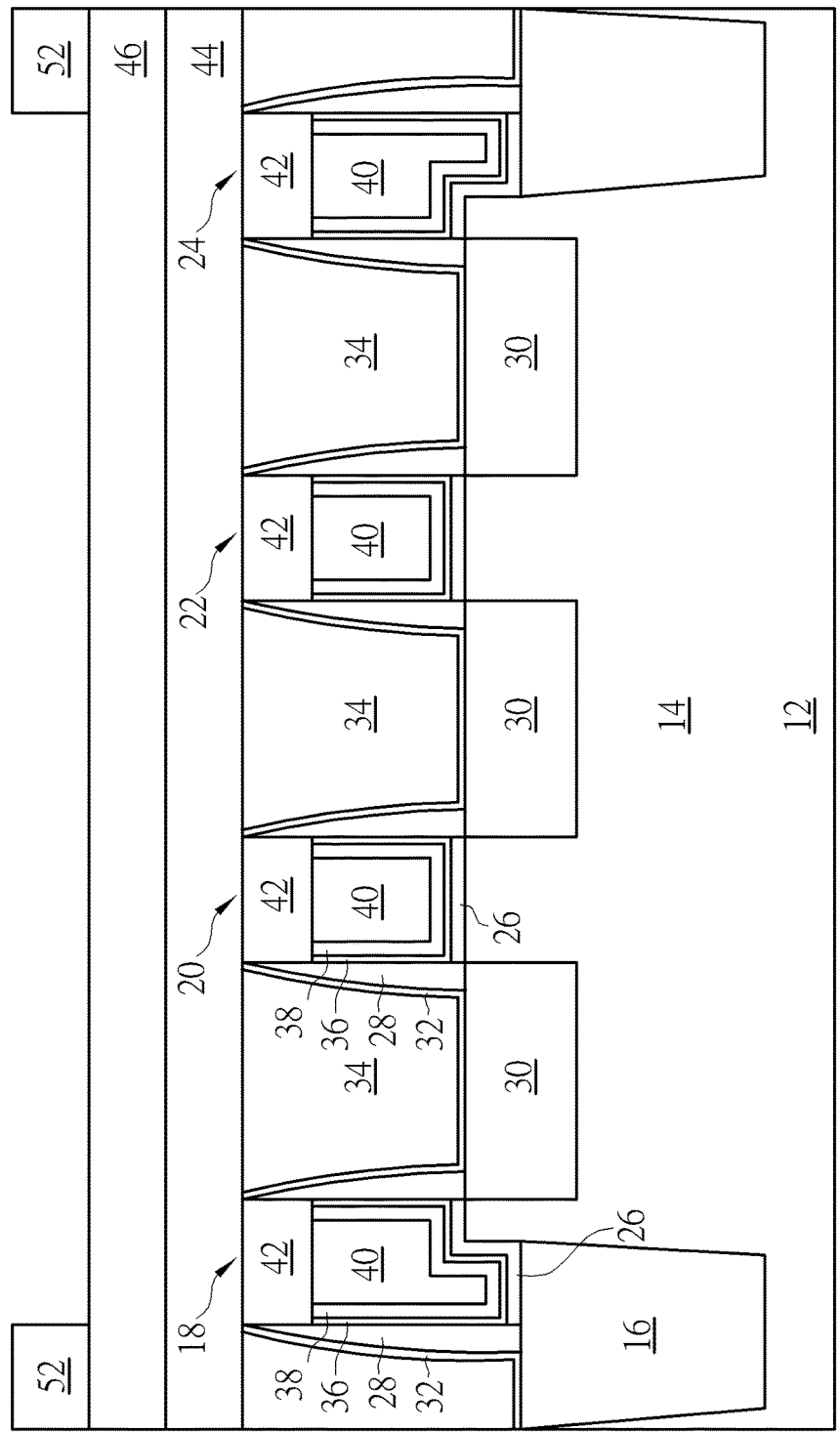
FIG. 3 illustrates a top view for fabricating a semiconductor device after forming the patterned mask in FIG. 1.

Next, as shown in FIG. 3, an etching process is conducted by using the patterned mask 50 to remove part of the mask layer 48. This forms a patterned mask 52 on the mask layer 46 and exposes part of the mask layer 46 surface. The patterned mask 50 is removed thereafter.

Figure 4:
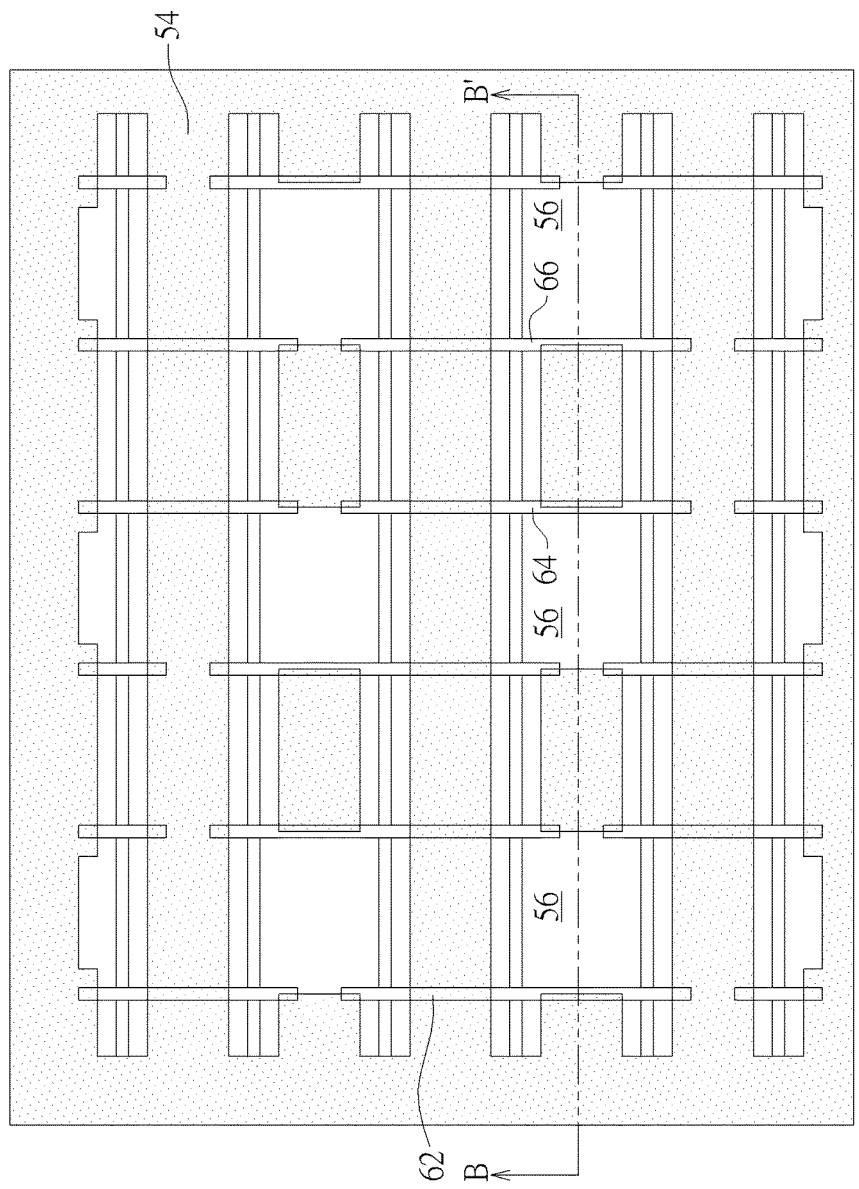
Figure 5:
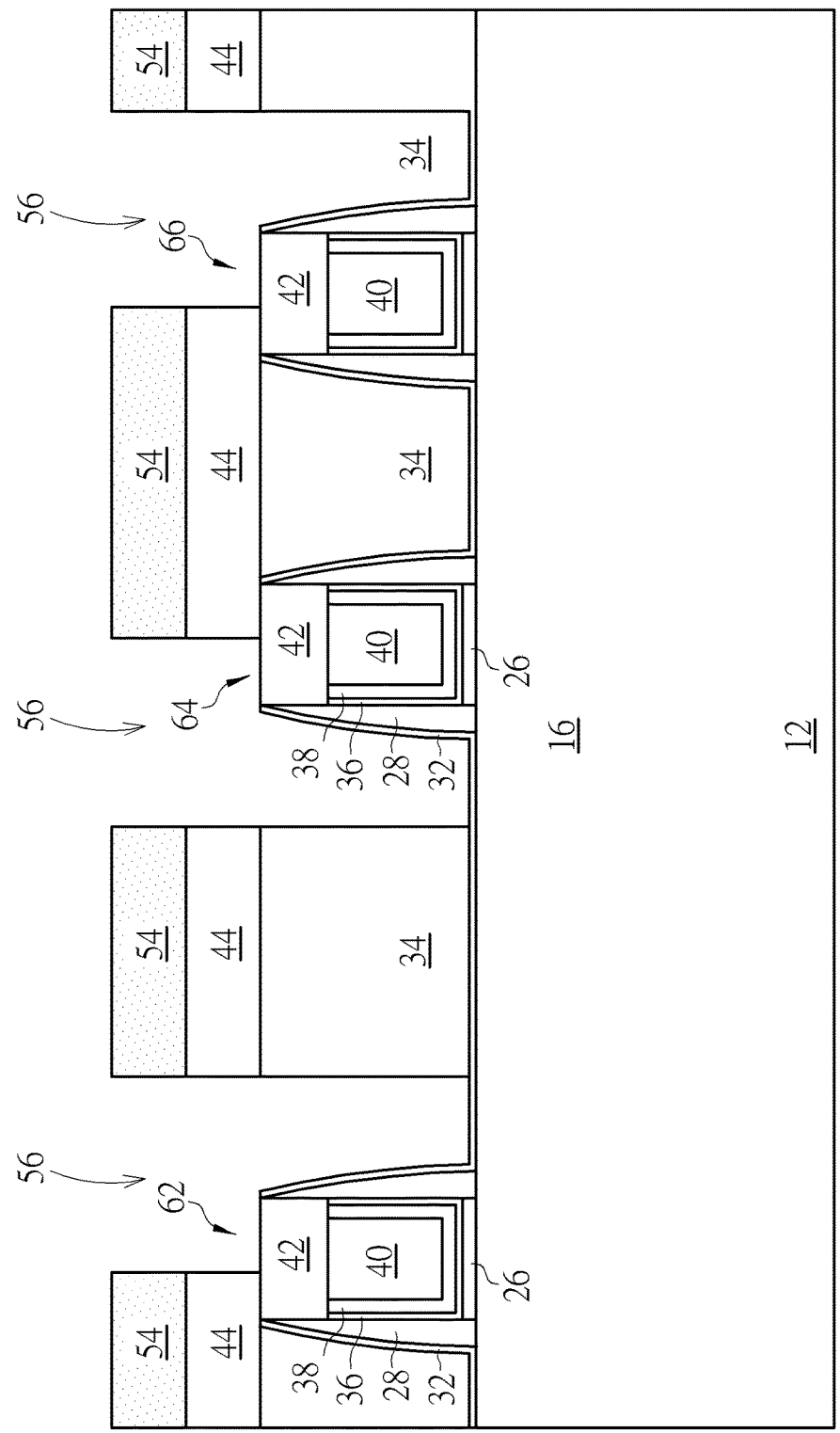
FIG. 5 illustrates a cross-sectional view of FIG. 4 along the sectional line BB'.

Next, referring to FIGS. 4-5, in which FIG. 4 illustrates a top view for fabricating a semiconductor device after forming the patterned mask 52 in FIG. 1 and FIG. 5 illustrates a cross-sectional view of FIG. 4 along the sectional line BB'. As shown in FIG. 4-5, an etching process is conducted by using another mask (not shown) to remove part of the mask layer 46 for forming a patterned mask 54, and yet another etching process is conducted by using the patterned mask 54 as etching mask and hard masks 42 on the gate structures 62, 64, 66 as self-aligned masks to remove part of the cap layer 44 and part of the ILD layer 34 adjacent to the gate structures 62, 64, 66 for forming contact holes 56. The patterned mask 52 could be removed thereafter.

It should be noted that since the patterned mask 54 only covers part of the gate structures 62, 64, 66 or only covers one side of each of the gate structures 62, 64, 66 in particular, the contact holes 56 are preferably formed only on one side of the gate structures 62, 64, 66 while the other side of the gate structures 62, 64, 66 is stilled filled with ILD layer 34.

Figure 6:
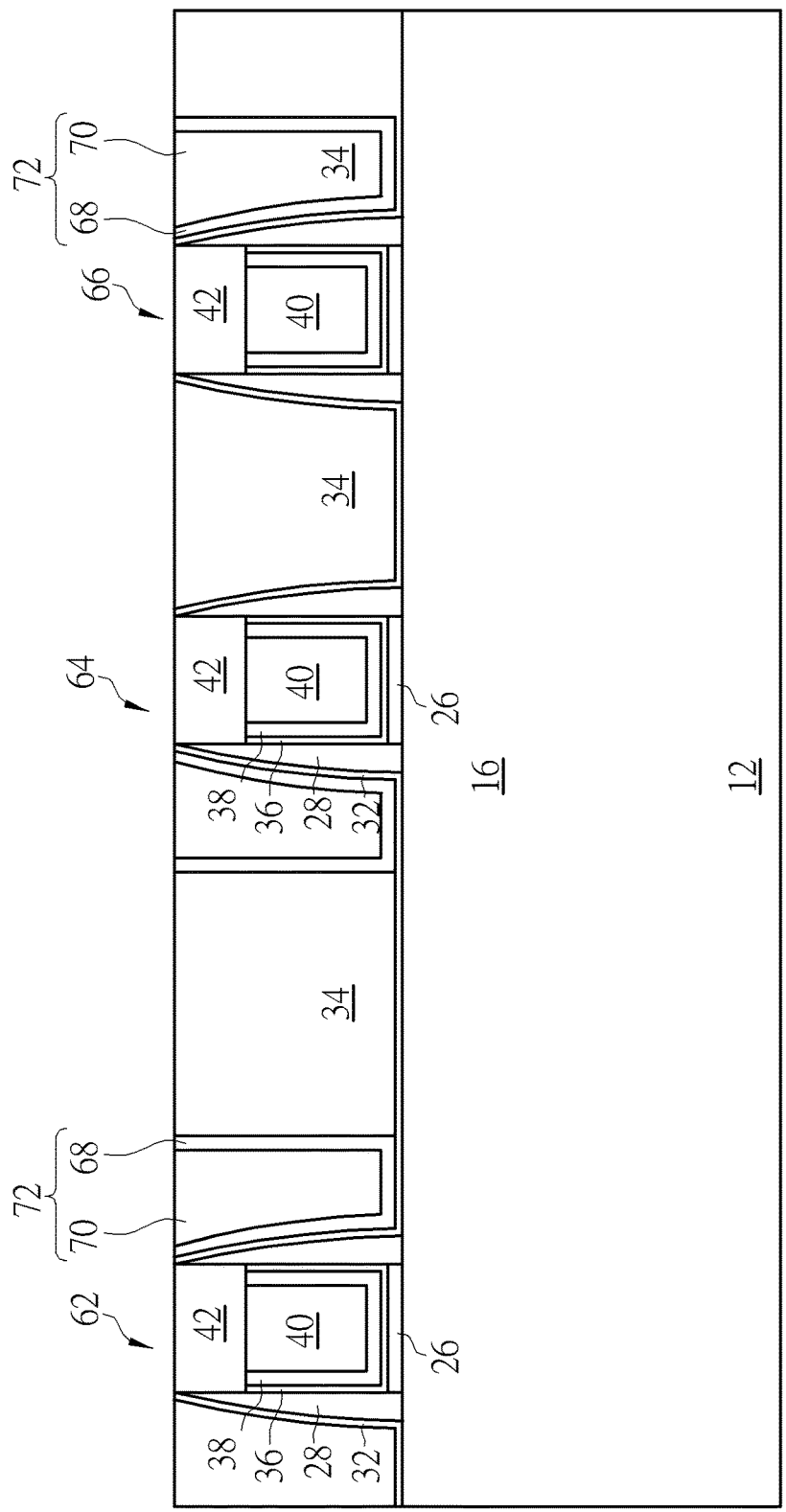
FIG. 6 illustrates a structural view of a semiconductor device according to an embodiment of the present invention.

Next, as shown in FIG. 6, a contact plug formation process is conducted by first depositing a barrier layer 68 and a metal layer 70 composed of low resistance material on the gate structures 62, 64, 66, ILD layer 34, patterned mask 54, and cap layer 44 while filling the contact holes. Next, a planarizing process, such as CMP process is conducted to remove part of the metal layer 68, part of the barrier layer 70, patterned mask 54, and cap layer 44 to form a plurality of contact plugs 72. In this embodiment, the barrier layer 68 could be selected from the group consisting of Ti, TiN, Ta, and TaN, and the metal layer 70 could be selected from the group consisting of W, Cu, Al, TiAl, and CoWP. It should be noted that since the contact plugs 72 are preferably formed in the substantially H-shaped openings of the patterned mask 54 or contact holes 56 illustrated in FIG. 4, the resulting contact plugs 72 formed after the planarizing process would also be H-shaped if viewed from the top. This completes the fabrication of a semiconductor device according to a preferred embodiment of the present invention.

Figure 7:
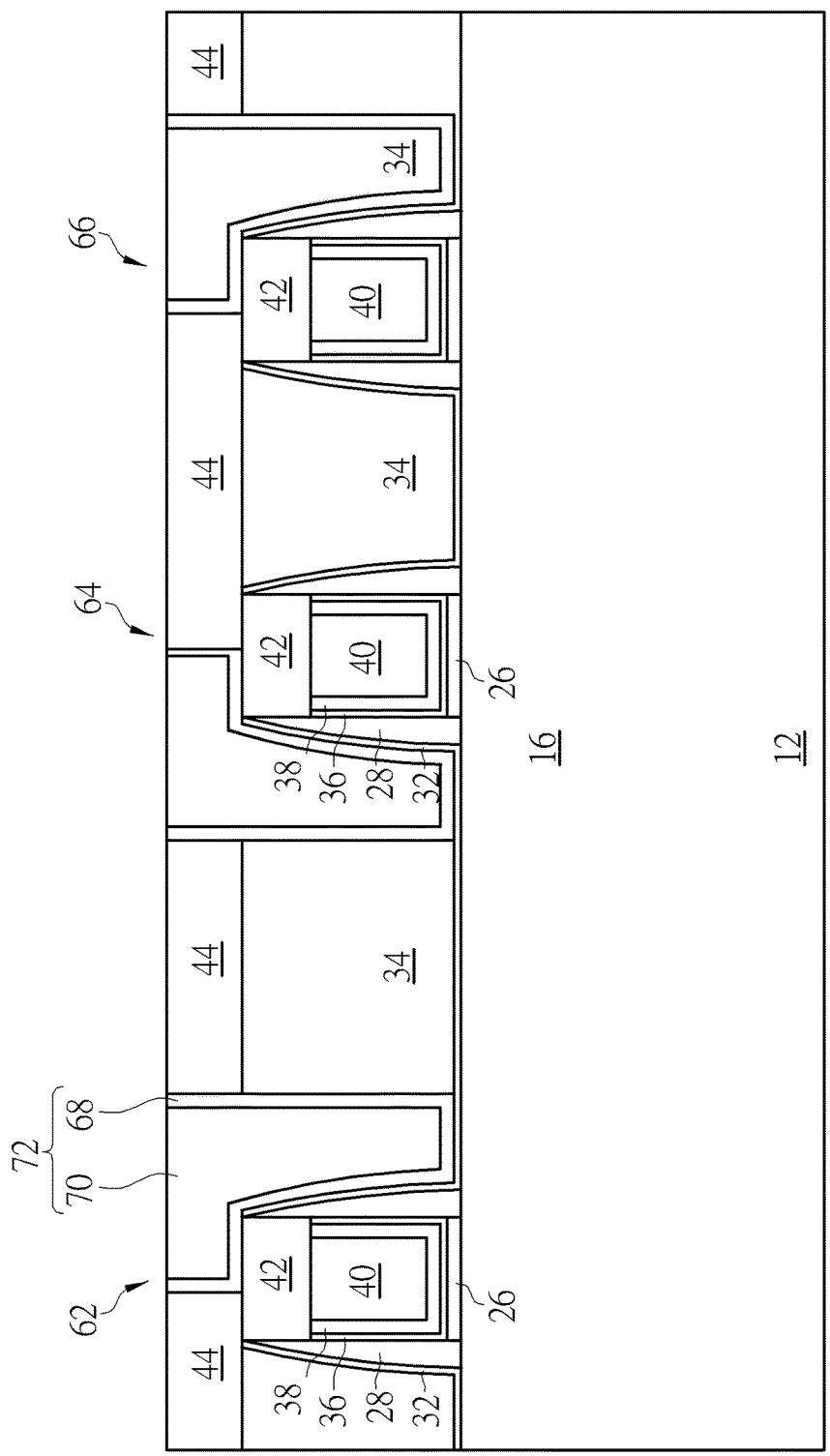
FIG. 7 illustrates a structural view of a semiconductor device according to an embodiment of the present invention.

Referring to FIG. 7, which further illustrates a structural view of the semiconductor device according to an embodiment of the present invention. Alternatively, as shown in FIG. 7, instead of fully removing the patterned mask 54 and cap layer 44 during the formation of contact plugs 72, it would also be desirable to conduct the planarizing process to only remove the patterned mask 54 and stop on the cap layer 44 so that the resulting top surface of the contact plugs 72 would be even with the top surface of the cap layer 44, which is also within the scope of the present invention.

Referring again to FIGS. 6-7, which further illustrate structural views of a semiconductor device according to different embodiments of the present invention. As shown in FIGS. 6-7, the semiconductor device preferably includes a substrate 12, at least a gate structure 62 on the substrate 12, a spacer 28 around the gate structure 62, a CESL 32 on the spacer 28, an ILD layer 34 adjacent to one side of the gate structure 62 and contacting the CESL 32, and a contact plug 72 adjacent to another side of the gate structure 62 and contacting the CESL 32.

The gate structure 62 is a metal gate, which preferably includes a high-k dielectric layer 36, a work function metal layer 38, and a low resistance metal layer 40. A hard mask 42 is disposed on the gate structure 62, and a top surface of the hard mask 42 and a top surface of the ILD layer 34 are coplanar.

In the embodiment illustrated in FIG. 6, the top surface of the contact plug 72 is even with the top surface of the ILD layer 34. The top surface of the contact plug 72 shown in FIG. 7 on the other hand is even with the top surface of the cap layer 44, in which the contact plug 72 is not only disposed adjacent to one side of the gate structure 62, but also extending to the top of the gate structure 62 and contacting the top surface of the hard mask 42.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
   a substrate;
   a gate structure on the substrate;
   a spacer around the gate structure;
   a contact etch stop layer (CESL) on the spacer;
   an interlayer dielectric (ILD) layer adjacent to one side of the gate structure and contacting the CESL; and
   a contact plug adjacent to another side of the gate structure and contacting the CESL directly, wherein one sidewall of the contact plug and a bottom surface of the contact plug contact the CESL directly and another sidewall of the contact plug contacts the ILD layer directly and the top surfaces of the contact plug and the CESL are coplanar.

2. The semiconductor device of claim 1, further comprising a hard mask on the gate structure.

3. The semiconductor device of claim 2, wherein a top surface of the hard mask and a top surface of the ILD layer are coplanar.

4. The semiconductor device of claim 2, wherein the contact plug contacts a top surface of the hard mask.

5. The semiconductor device of claim 1, wherein the gate structure comprises a metal gate.

6. The semiconductor device of claim 5, wherein the metal gate comprises a high-k dielectric layer, a work function metal layer, and a low resistance metal layer.

7. The semiconductor device of claim 1, further comprising a cap layer on the ILD layer and the gate structure.

8. The semiconductor device of claim 7, wherein a top surface of the cap layer and a top surface of the contact plug are coplanar.

9. A semiconductor device, comprising:
   a gate structure on a substrate;
   a spacer around the gate structure;
   a contact etch stop layer (CESL) on the spacer;
   an interlayer dielectric (ILD) layer adjacent to one side of the gate structure and contacting the CESL;
   a contact plug adjacent to another side of the gate structure and contacting the CESL directly; and
   a shallow trench isolation (STI) under the gate structure and the contact plug, wherein the contact plug overlaps the STI entirely.

* * * * *